US007113604B2

(12) United States Patent
Thompson

(10) Patent No.: US 7,113,604 B2
(45) Date of Patent: Sep. 26, 2006

(54) APPARATUS AND METHOD FOR MATCHING THE RESPONSE OF MICROPHONES IN MAGNITUDE AND PHASE

(75) Inventor: Stephen C. Thompson, Naperville, IL (US)

(73) Assignee: Knowles Electronics, LLC., Itasca, IL (US)

( * ) Notice: Subject to any disclaimer, the term of this patent is extended or adjusted under 35 U.S.C. 154(b) by 315 days.

(21) Appl. No.: 10/425,143

(22) Filed: Apr. 29, 2003

(65) Prior Publication Data

US 2003/0198356 A1 Oct. 23, 2003

Related U.S. Application Data

(62) Division of application No. 09/193,012, filed on Nov. 16, 1998.

(60) Provisional application No. 60/097,926, filed on Aug. 25, 1998.

(51) Int. Cl.

| | |
|---|---|
| ***H04R 3/00*** | (2006.01) |
| ***H04R 25/00*** | (2006.01) |
| ***H03R 1/40*** | (2006.01) |
| ***H03G 3/00*** | (2006.01) |

(52) U.S. Cl. .......................... 381/92; 381/97; 381/104; 381/312

(58) Field of Classification Search .................. 381/92, 381/97–99, 312–313, 104–107, 95, 321, 381/111–115

See application file for complete search history.

(56) References Cited

U.S. PATENT DOCUMENTS

| | | | | |
|---|---|---|---|---|
| 4,412,097 | A * | 10/1983 | Ishigaki et al. | 381/92 |
| 4,420,655 | A | 12/1983 | Suzuki | |
| 4,509,022 | A | 4/1985 | Ridel | |
| 4,622,440 | A | 11/1986 | Slavin | |
| 4,718,099 | A * | 1/1988 | Hotvet | 381/317 |
| 5,978,490 | A | 11/1999 | Choi et al. | |
| 6,035,049 | A * | 3/2000 | Engh et al. | 381/121 |
| 6,389,142 | B1 | 5/2002 | Hagen et al. | |
| 6,421,448 | B1 * | 7/2002 | Arndt et al. | 381/312 |
| 6,654,468 | B1 * | 11/2003 | Thompson | 381/92 |

FOREIGN PATENT DOCUMENTS

| | | |
|---|---|---|
| EP | 0 509 742 A2 | 10/1992 |
| JP | 59-64994 | 4/1984 |

* cited by examiner

*Primary Examiner*—Laura A. Grier
(74) *Attorney, Agent, or Firm*—Marshall, Gerstein & Borun LLP

(57) ABSTRACT

An apparatus is provided for matching the response of a pair of microphones. The two microphones provide a first and second output, respectively, in response to an audible input. The microphone outputs are subtract from each other to produce a gain control output for operably controlling the gain of the first microphone output, resulting in a gain compensated microphone output. A phase adjustment circuit also is provided responsive to the gain compensated microphone output and a rolloff control output for producing a matching output. The rolloff control output is generated by a phase difference subtractor circuit responsive to both the matching output and the second microphone output. Moreover, the output of at least one of the microphones has a resonance frequency that is shifted to a desired preselected frequency.

10 Claims, 7 Drawing Sheets

FIG. 7

| SCHEMATIC | TRANSFER FUNCTION | COMMENTS |
|---|---|---|
| 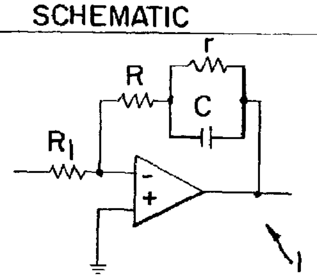 | $-\frac{R+r}{R_1}\left[\frac{1+jw\frac{Rr}{R+r}C}{1+jwrC}\right]$ | CAN BE USED TO RAISE THE ROLLOFF FREQUENCY.<br>INVERTING |
| 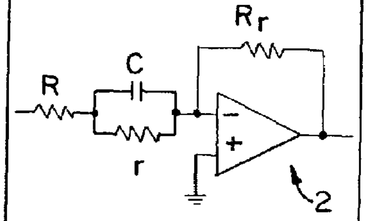 | $-\frac{R_1}{R+r}\left[\frac{1+jwrC}{1+jw\frac{Rr}{R+r}C}\right]$ | CAN BE USED TO LOWER THE ROLLOFF FREQUENCY.<br>INVERTING |
| 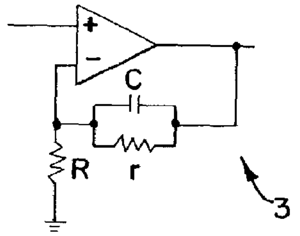 | $\frac{R+r}{R}\left[\frac{1+jw\frac{Rr}{R+r}C}{1+jwrC}\right]$ | CAN BE USED TO RAISE THE ROLLOFF FREQUENCY.<br>NON-INVERTING |
| 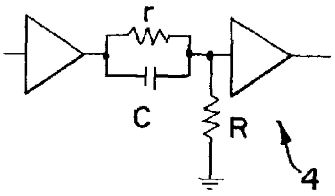 | $\frac{R}{R+r}\left[\frac{1+jwrC}{1+jw\frac{Rr}{R+r}C}\right]$ | CAN BE USED TO RAISE THE ROLLOFF FREQUENCY.<br>NON-INVERTING |
| 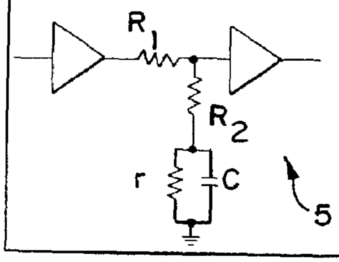 | $\frac{r+R_2}{r+R_1+R_2}\left[\frac{1+jw\frac{rR_2}{r+R_2}C}{1+jw\frac{r(R_1+R_2)}{r+R_1+R_2}C}\right]$ | CAN BE USED TO LOWER THE ROLLOFF FREQUENCY.<br>NON-INVERTING |

FIG. 8

<table>
<tr><th>SCHEMATIC</th><th>TRANSFER FUNCTION</th><th>COMMENTS</th></tr>
<tr><td>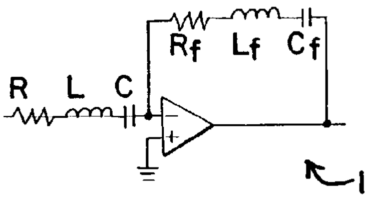
</td><td>$-\frac{C}{C_f}\,\frac{1-jw^2L_fC_f+jwR_fC_f}{1-jw\ LC+jwRC}$</td><td>CAN EITHER RAISE OR LOWER THE RESONANCE FREQUENCY.<br>INVERTING</td></tr>
<tr><td>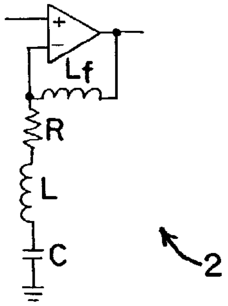
</td><td>$\frac{L}{L+L}\,\frac{1-jw^2(L+L_1)C+jwRC}{1-jw^2LC+jwRC}$</td><td>CAN RAISE THE RESONANCE FREQUENCY.<br>NON-INVERTING</td></tr>
<tr><td>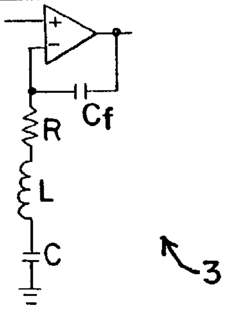
</td><td>$\frac{C_1}{C}\,\frac{1-jw^2LC+jwRC}{1-jw^2LC_1+jwRC_1}$<br>WHERE<br>$C_1=\frac{CC_f}{C+C_f}$</td><td>CAN RAISE THE RESONANCE FREQUENCY.<br>NON-INVERTING</td></tr>
<tr><td>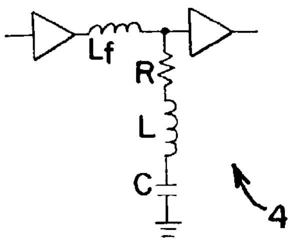
</td><td>$\frac{L+L_f}{L}\,\frac{1-jw^2LC+jwRC}{1-jw^2(L+L_f)C+jwRC}$</td><td>CAN LOWER THE RESONANCE FREQUENCY.<br>NON-INVERTING</td></tr>
<tr><td>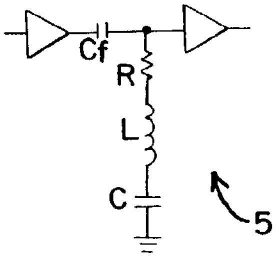
</td><td>$\frac{C}{C_1}\,\frac{1-jw^2LC_1+jwRC_1}{1-jw^2LC+jwRC}$<br>WHERE<br>$C_1=\frac{CC_f}{C+C_f}$</td><td>CAN LOWER THE RESONANCE FREQUENCY.<br>NON-INVERTING</td></tr>
</table>

APPARATUS AND METHOD FOR MATCHING THE RESPONSE OF MICROPHONES IN MAGNITUDE AND PHASE

RELATED APPLICATIONS

This application is a divisional of copending U.S. application Ser. No. 09/193,012, filed Nov. 16, 1998, which was a nonprovisional application of U.S. Provisional Application No. 60/097,926, filed Aug. 25, 1998, upon which a claim of priority is based.

TECHNICAL FIELD

The present invention generally relates to devices for matching outputs of a pair of microphones, and in particular to an apparatus and a method that compensates for variations in the sensitivity, low frequency rolloff, and resonance peak of at least one of the microphones.

BACKGROUND OF THE INVENTION

Hearing aids for providing a user selectable directional response have become quite popular in the marketplace. In a noisy environment, the user of such an aid can select the directional pattern and thus eliminate some of the noise coming from the rear. This can increase the signal to noise level enough to improve the intelligibility of speech originating from the forward direction. In a quiet environment, the user would normally switch to the nondirectional pattern in favor of its better performance in quiet.

One way to achieve a directional response in a hearing aid is to use two omnidirectional microphones, and to combine their electrical signals to form the directional beam. Compared to the use of a directional microphone, the Dual Omni approach has some advantages. However, it also carries the requirement that the response of the two microphones be accurately matched in magnitude and phase. The matching must be accurate throughout the frequency band where directionality is needed, and must remain matched throughout the life of the hearing aid. Normal variations in microphone manufacturing do not provide a close enough match for most applications.

Often it has been necessary to specially measure and select the microphones for use in a paired application. The present invention presents an apparatus and method of compensation for the variations in microphone performance. An electrical circuit is used with one or both of the microphones to achieve the necessary match in response for directional processing. The response of the circuit can be "tuned" to each microphone at the final stages of manufacturing, as a part of the fitting porches, automatically, or even at a periodic follow-up visit if the characteristics of the microphone have changed through aging or abuse.

The Microphone Model

A simple model for a microphone is assumed herein. The frequency response shown in FIGS. 1 and 2 is characteristic of many electret microphone designs used in devices such as hearing aids. Mathematically, the response can generally be represented as:

$$M(\omega)=M_0L(\omega)H(\omega)$$

where $L(\omega)$ models the low frequency rolloff, and $H(\omega)$ models the mid and high frequency behavior, including the diaphragm resonance.

The assumption that the microphone response can be separated in this way makes the analysis much simpler without introducing a significant error for most actual microphone responses used for directional hearing aids and the like. It works well for any microphone whose low frequency rolloff is separated in frequency from its diaphragm resonance. (The so-called "ski slope" microphone responses are not of this variety and would require a different analysis; but they are not well suited for use in devices such as directional hearing aids.)

The low frequency rolloff is approximated as a single-pole filter:

$$L(\omega)=\frac{j\frac{\omega}{\omega_l}}{1+j\frac{\omega}{\omega_l}}$$

where $\omega_l$ is the corner frequency for the low frequency rolloff. The higher frequency behavior is approximated by:

$$H(\omega)=\frac{1}{1-\frac{\omega^2}{\omega_r^2}+j\frac{\omega}{Q\omega_r}}$$

where $\omega_r$ is the corner diaphragm resonance frequency and Q is the mechanical quality factor of that resonance.

Variations in production may cause the response of an individual microphone to vary in several ways from this nominal response: 1) The sensitivity level $M_0$ of the entire curve may shift to higher or lower values due to variations in electret charge or diaphragm stiffness; 2) The corner frequency $\omega_l$ of the low frequency rolloff may move to a higher or lower frequency due to variation in the size of the barometric relief hole in the diaphragm; and 3) The frequency $\omega_r$ of the resonance peak may shift to a higher or lower value due to variation in the diaphragm tension or other assembly details. Each of these changes has a different impact on the ability to obtain an adequate match for directional processing.

The phase error caused by differences in $\omega_l$ and $\omega_r$ can be seen in FIG. 3. This shows the phase difference between the two microphone outputs when there is a 10% shift in the low frequency rolloff and a 10% shift in the resonance frequency.

SUMMARY OF THE INVENTION

The present invention provides for matching the response of a pair of microphones.

The structure embodying the present invention is especially suitable for providing directional response. The invention provides for compensating for gain differences between the pair of microphones. Also, the invention compensates for shifts in the low frequency rolloff and resonance frequency of at least one of the microphones.

The circuitry embodying the present invention includes a pair of microphones that generate a first and a second output, respectively, in response to an audible sound. The microphone outputs are subtract from each other to produce a gain control output that operably controls the gain of the first microphone output resulting in a gain compensated microphone output. Also, a phase adjustment circuit responsive to both the gain compensated microphone output and a rolloff control output is provided to produce a matching output. The rolloff control output is generated by a phase difference subtractor circuit responsive to both the matching output and the second microphone output. Moreover, a resonance frequency shifting circuit is provided, response to the output of at least one microphone, to compensate for shifting the resonance frequency of the microphone output.

BRIEF DESCRIPTION OF THE DRAWINGS

In the accompanying drawings that form part of the specification, and in which like numerals are employed to designate like parts throughout the same.

FIG. 7 is a plurality of simplified electrical circuit diagrams, partially in block form, of various circuits for shifting the low frequency rolloff of a microphone output;

FIG. 8 is a plurality of simplified electrical circuit diagram, partially in block form, of various circuits for shifting the resonance frequency of a microphone output;

DETAILED DESCRIPTION

Figure 1:
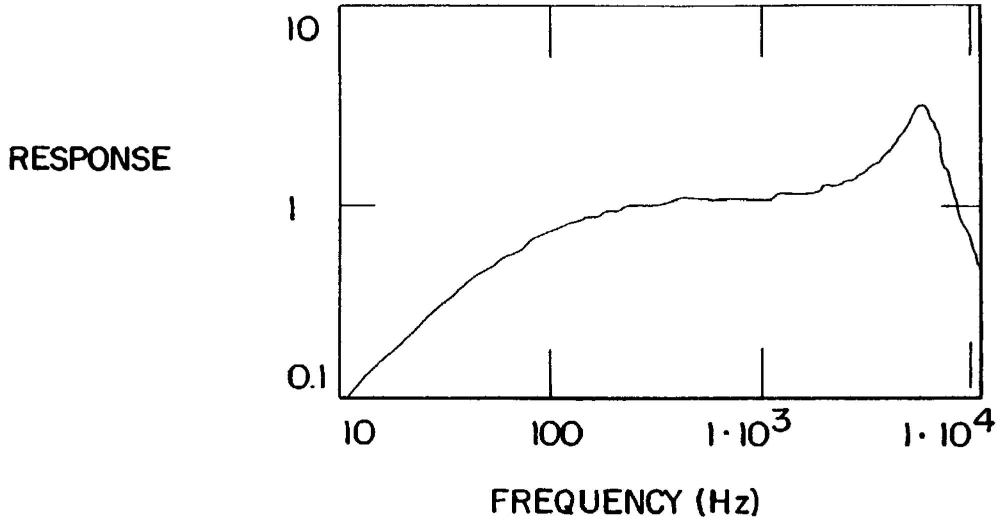
FIG. 1 is a graph of the magnitude response of a simplified microphone model over a frequency range.
Figure 2:
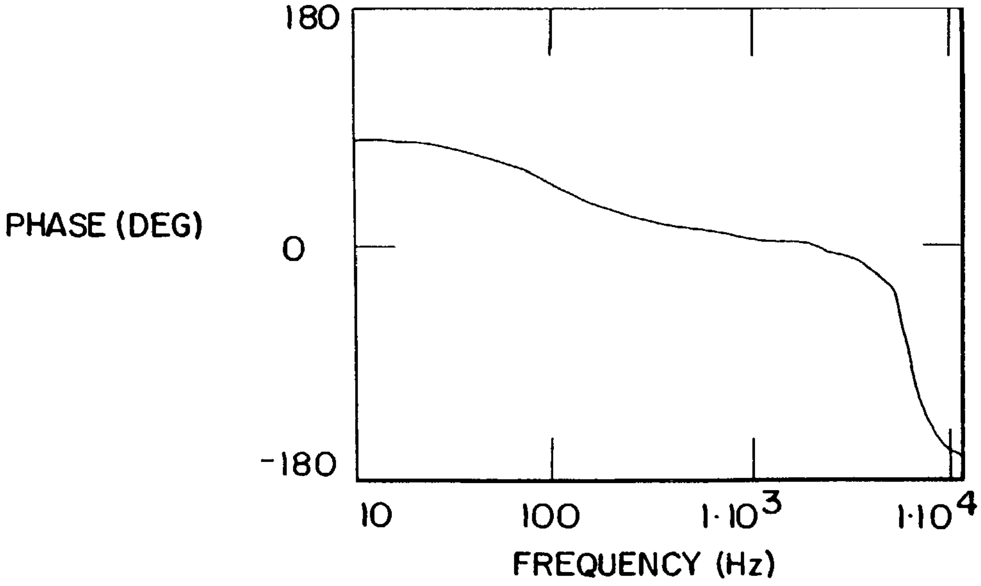
FIG. 2 is a graph of the phase response of the same simplified microphone model used in FIG. 1 over the same frequency range.

While this invention is susceptible of embodiments in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiments illustrated. The present invention provides an apparatus and method for matching the response of microphones in magnitude and phase.

Compensating for Gain Differences

The present invention includes compensation to equalize the midband sensitivity $M_0$. In an embodiment, such as for a hearing aid, this can be done either in a sound box or in the sound field of a room. Alternatively, it can be done as a final step in the manufacturing process, during the fitting process, or as a "tune up" during a periodic checkup. Preferably, the frequency content of the acoustic test signal used to equalize the midband is confined to the flat portion of the sensitivity curve, which is generally near 1 kHz. For example, an appropriate signal would be a one-third octave noise band centered at 1 kHz.

In analog circuitry, the gain adjustment can be implemented with a simple trimmer to adjust the gain. In a device such as a programmable hearing aid, the gain value can be stored in memory and implemented in a programmable resistor. Each of these can also provide for periodic recalibration in the office of an audiologist.

Figure 4:
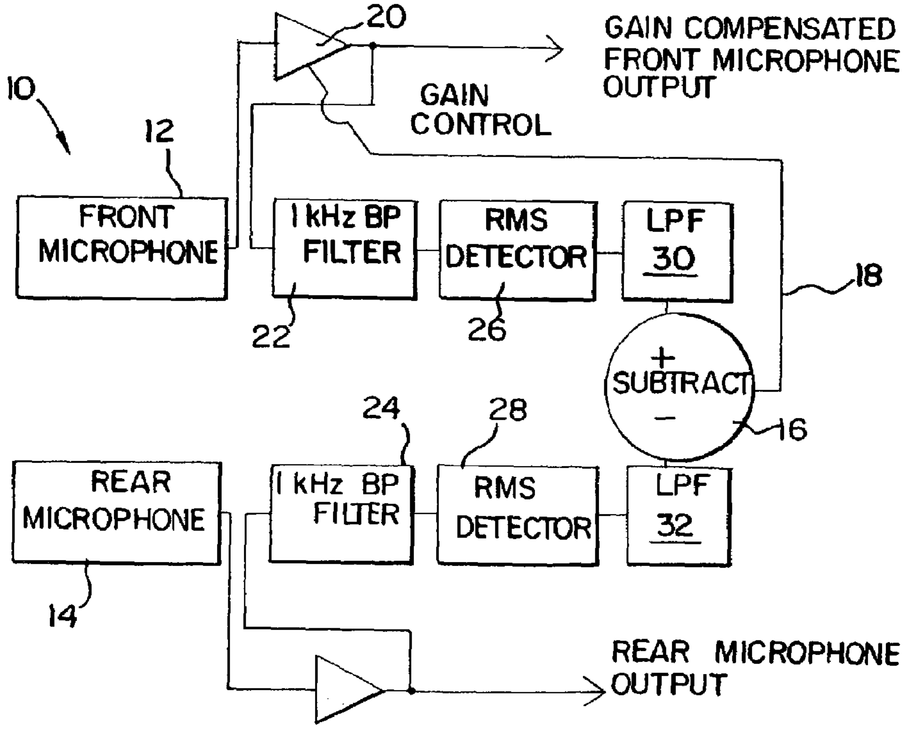
FIG. 4 is a simplified electrical circuit diagram, partially in block form, of a method to compensate for variations in midband sensitivity between two microphones.

In an embodiment, a very slow acting automatic gain control ("AGC") operates on the output of one microphone to match its output to the level of the other. A block diagram 10 of such a system is shown in FIG. 4. The system can be mounted, for example, within a hearing aid housing and includes a front microphone 12 and a rear microphone 14 having respective outputs responsive to an audible input. A subtractor circuit 16 is provided responsive to the front microphone output and the rear microphone output for producing a gain control output 18. In response to the front microphone output and the gain control output 18, circuit 20 produces a gain compensated microphone output.

More particularly, the signal from each microphone 12, 14 is buffered and processed through a bandpass filter ("BPF") 22, 24 with a center frequency of approximately 1 kHz. Each filtered signal is sent through an energy detector, such as an RMS detector 26, 28, and then a low pass filter 30, 32. At this point, the signals represent the time average of the signal energy in each channel. These level estimates are subtracted by circuit 16 to provide signal 18 proportional to the level difference between the microphone channels. This difference level is used to adjust the gain in one channel to better match the level of the other signal.

If the microphones 12, 14 were exactly matched in sensitivity, then the energy estimates would be equal. Accordingly, the subtraction would give a zero output, and the compensating gain would remain unchanged. If the microphone sensitivity were to change, then an error signal would be generated at the output 18 of the subtraction circuitry 16, and that error signal would change the gain in one channel to bring the two channels to equal output levels.

Preferably, the time constant of the AGC loop is long compared to the acoustic time delay between the signals from the two microphones, and long compared to the variability in level of speech. For example, in an embodiment, a time constant of 250 ms or greater can be used.

Compensating for Low Frequency Rolloff

Figure 3:
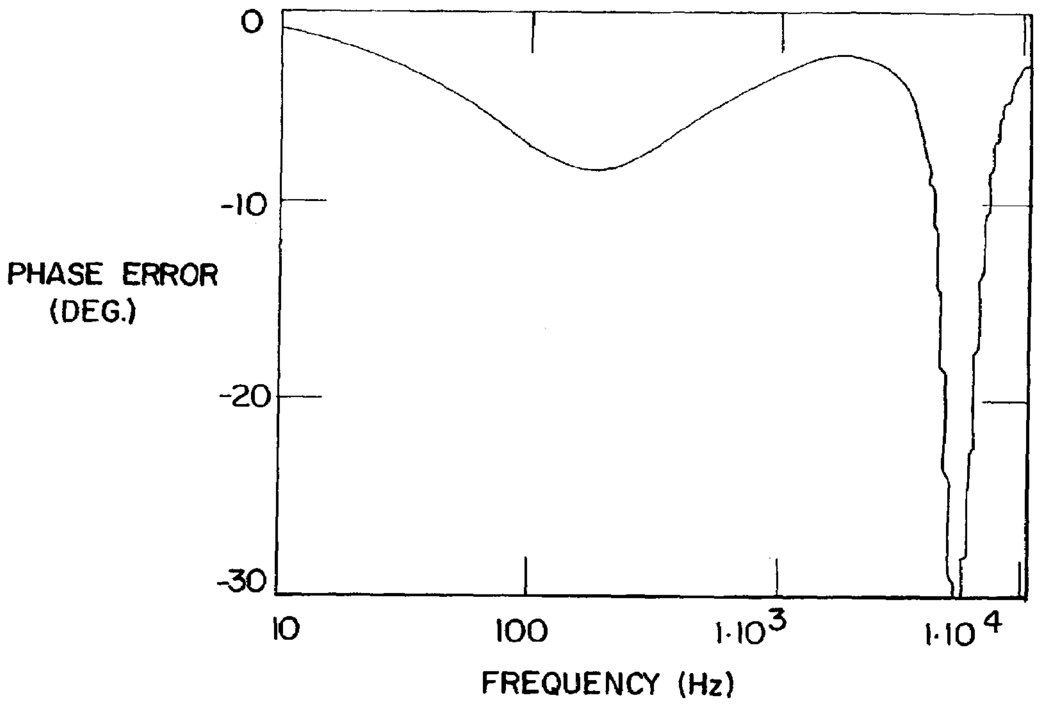
FIG. 3 is a graph of the phase difference between two microphones with different corner frequencies for low frequency rolloff and different resonance peak frequencies.

As previously indicated, it is desirable to match the low frequency rolloff of the two microphones because phase errors at low frequencies are especially likely to degrade the directionality. FIG. 3 shows that the phase error extends an octave or more above the corner frequency. In order to maintain good directionality below 500 Hz with microphones not having accurately matched rolloff frequencies, it is advantageous that the low frequency rolloff be below 100 Hz. This has other disadvantages, however. The low frequency response allows significant low frequency acoustic noise from the environment to enter the microphone electronics. In some situations, this noise may saturate the low-level amplifiers. Once saturation occurs, electrical filters can no longer be used to remove the low frequency energy. A better solution is to provide an electrical compensation circuitry to match the phase of the two microphones so it is not necessary to use a very low rolloff frequency.

The primary advantage that comes with low frequency compensation is that the rolloff frequency can be accurately set at a specific frequency in the range of 150 to 250 Hz. If the two microphones are accurately matched after compensation, then good directionality is available throughout the low frequency range, and low frequency environmental noise will not corrupt the signals.

If a microphone has a low frequency corner frequency of $\omega_l$, but the desired frequency is $\omega_d$, then the transfer function or the compensation circuitry needed to shift the rolloff is:

$$Comp(\omega) = \frac{\omega_l}{\omega_d}\frac{1 + j\frac{\omega}{\omega_l}}{1 + j\frac{\omega}{\omega_d}}$$

Figure 5:
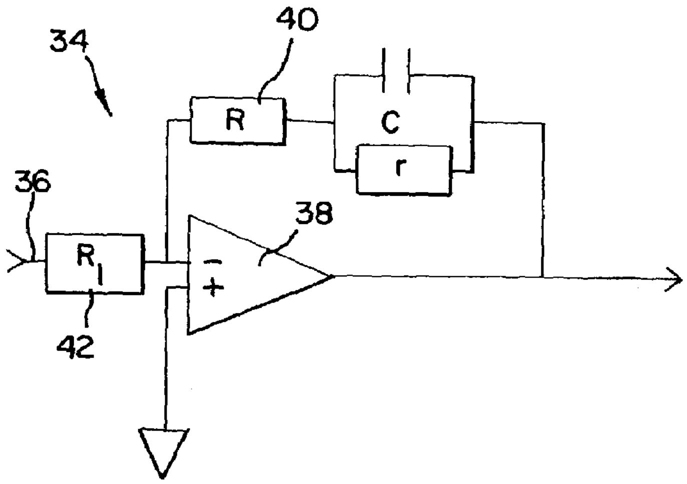
FIG. 5 is a simplified electrical circuit diagram, partially in block form, of a circuit to shift the low frequency rolloff of a microphone output.

The circuit of FIG. 5 has the following transfer function:

$$T(f) = \frac{R+r}{R_i}\frac{1 + j\omega\frac{Rr}{R+r}C}{1 + j\omega rC}$$

Except for the minus sign, T(f) can be made equivalent to Comp(ω) if:

$$r = \frac{1}{\omega_d C}$$

and $$R = r\frac{\omega_d}{\omega_l - \omega_d}$$

In the above equations and FIG. 5, C can be chosen arbitrarily, and $R_i$ can be chosen independently to set the high frequency gain of the network. The circuit 34 within FIG. 5 works only if $\omega_d$ is less that $\omega_l$, in other words, the compensation circuit 34 can be used to lower the rolloff frequency, but not to raise it. Circuit 34 is only one example of many that can compensate the phase of a microphone. Other examples are discussed later herein.

In general, the circuit 34 includes an input terminal 36, for receiving an output from a hearing aid microphone or the like, and an amplifier 38 having an inverting input and an output. Connected to the output of the amplifier 38 and the inverting input is a feedback circuit that includes a feedback adjustment circuit 40 responsive to a rolloff control input. Further, a gain control circuit 42 is operably connected between the input terminal 36 and the inverting input of the amplifier 38 for adjusting the gain of the microphone output.

Circuit 34 can be used in a compensation system in the following way: The corner frequencies for low frequency rolloff for both of the two microphones are first measured. Then, the compensation circuit is applied to the microphone with the higher corner frequency to match it to the microphone with the lower frequency rolloff. As an alternative, the microphones can be specified with a rolloff frequency that is slightly higher than the desired value in the final device such as a hearing aid. The compensation circuit can be applied to both microphones to match their rolloff to the desired frequency.

Measuring the rolloff frequencies of the two microphones can effectively be accomplished in the above embodiments by using the facilities of an acoustic test box. As such, an automated test system can be used to measure the frequency response of the two microphones and determine the component settings to achieve an adequate phase match.

Figure 6:
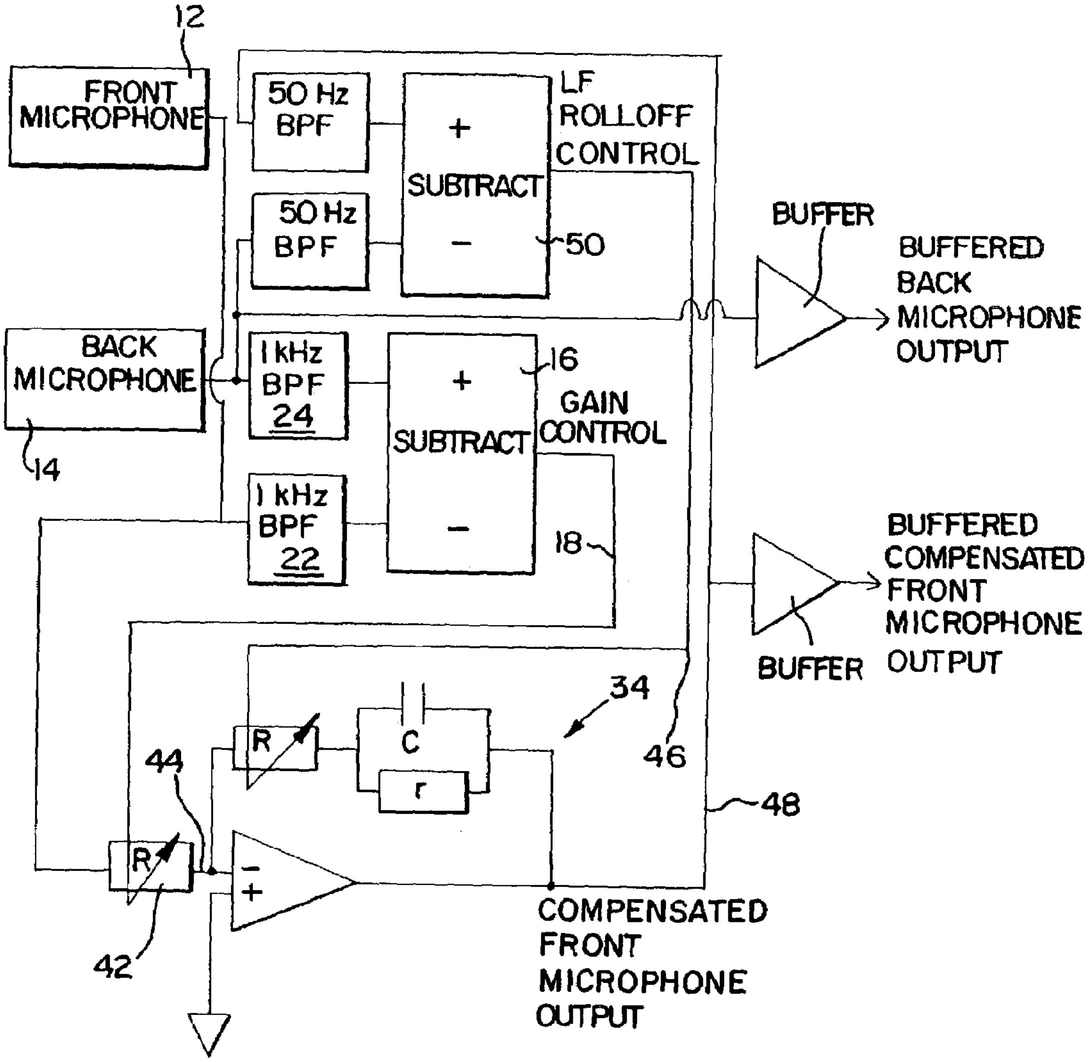
FIG. 6 is a simplified electrical circuit diagram, partially in block form, of an automated compensation system to equal both the midband sensitivity and the low frequency rolloff of a microphone.

In an alternative embodiment, an automated method to perform the low frequency compensation is shown in FIG. 6 which also includes the magnitude compensator described above. The automated method includes a front microphone 12 and a back microphone 14 for producing respective outputs in response to an audible input. Responsive to the microphone outputs is a gain difference subtractor circuit 16 for producing a gain control output. A gain control circuit 42 is provided that, in response to the front microphone output and the gain control output, produces a gain compensated microphone output 44. Phase adjustment circuit 34 is responsive to the gain compensated microphone output 44 and a rolloff control output 46 for producing a matching output 48. The rolloff control output is generated by a phase difference subtractor circuit 50 responsive to the matching output 48 and the back microphone output.

In particular, the frequency compensation circuit assures that the 50 Hz response of the two microphones is the same. As shown, the sensitivity of the front microphone 12 is modified to match that of the rear microphone 14. Using the magnitude compensated front microphone signal, the two signals are again filtered, this time with a 50 Hz center frequency, where 50 Hz is assumed to be well below the low frequency rolloff of both microphones 12, 14. If the rolloff of the two microphones were the same, the filtered output of the two channels would have the same magnitude. Any difference in the levels is an indication that the rolloff frequencies are different. This difference is used to adjust the controlling resistor value in the rolloff compensator circuit 34 for the front microphone 12.

Other examples of circuits that can be used to compensate the response are shown in FIGS. 7 and 8.

The primary advantage that comes with low frequency compensation is that the rolloff frequency may not be accurately set at a specific frequency in the range to 150 to 250 Hz. If the two microphones are accurately matched after compensation, then good directionality will be available throughout the low frequency range, and low frequency environmental noise will not corrupt the signals.

Compensating Shifts in Resonance Frequency

As stated above, the microphone model is the product of the midband sensitivity, the low frequency rolloff function and the high frequency resonance function, or $$M(\omega)=M_0L(\omega)H(\omega).$$

Previously, methods of compensation for variations between microphones in sensitivity and low frequency rolloff have been discussed. Compensation for the shifts in the resonance frequency follow the same development. The form of the high frequency response is:

$$H_d(\omega) = \frac{1}{1 - \frac{\omega^2}{\omega_d^2} + j\frac{\omega}{Q_d\omega_d}}$$

For the high frequency behavior, if the microphone has resonance frequency $\omega_r$, and Q-value $Q_r$, but the desired values for these parameters are $\omega_d$ and $Q_d$ respectively, then the transfer function of the compensation circuit needed to shift the resonance frequency is $$Comp_h(\omega) = \frac{H_d(\omega)}{H_r(\omega)} = \frac{1 - \frac{\omega^2}{\omega_r^2} + j\frac{\omega}{Q_r\omega_r}}{1 - \frac{\omega^2}{\omega_d^2} + j\omega\frac{\omega}{Q_d\omega_d}}$$

Figure 9:
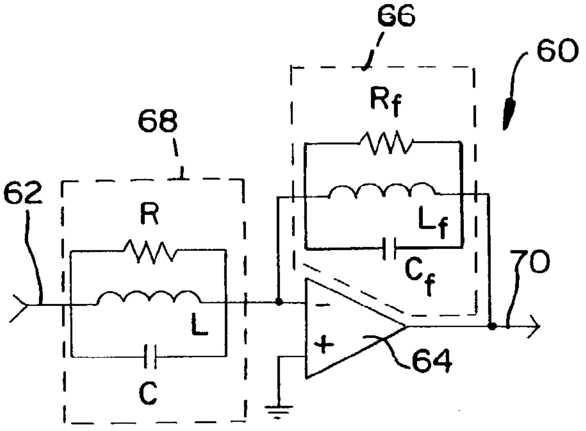
FIG. 9 is a simplified electrical circuit diagram, partially in block form, of a circuit to shift the resonance frequency of a microphone output.

FIG. 9 depicts a circuit 60 for microphone resonance frequency shift compensation. In general, the circuit 60 includes an input terminal 62 for receiving an output from a microphone, and an amplifier 64 having an inverting input and an output. Connected to the output of the amplifier 64 and the inverting input is a feedback circuit 66 that includes a resistor $R_f$, an inductor $L_f$, and a $C_f$ that are connected to each other in parallel. Further, an input circuit 68 is operably connected between the input terminal 62 and the inverting input of the amplifier 64 for adjusting the gain of the circuit output 70.

It is to be understood that circuit 60 an all other circuits presented herein are simplified and may have stability problems if implemented exactly as shown. It is assumed that the designer will add whatever components necessary to assure stability.

It can be shown that the circuit 60 of FIG. 9 has the following transfer function:

$$T(\omega) = -\frac{L_f}{L}\frac{1 - \omega^2 LC + j\omega\frac{L}{R}}{1 - \omega^2 L_f C_f + j\omega\frac{L_f}{R_f}}$$

The two above equations for $H_d(\omega)$ and $Comp_h(\omega)$ have the same form (except for the minus sign), and can be made equivalent by proper selection of the circuit values. To do this, the values of the feedback components $R_f$, $L_f$, and $C_f$ are chosen to match the desired resonance of the microphone, and the values of the components within the input circuit 68 are chosen to match the actual resonance. For accurate compensation, it is desirable to match both the resonance frequency and the Q of the actual microphone response. The inductor values L and $L_f$ can be equal if unity gain is desired in circuit 60, or they can have different values if desired to adjust the gain. Otherwise the inductor values L and $L_f$ can be chosen arbitrarily. Moreover, the value of one reactive component can be chosen arbitrarily.

As will be appreciated by those having skill in the art, other circuits that can be used to compensate the high frequency response such as, for example, those shown in FIG. 8. Each of these circuits would be employed with a different strategy to compensate the different responses between two microphones.

A Practical Example—Low Frequency Rolloff

In an example, assume that two microphones are used as a "matched" pair in a device such as a directional hearing aid. The microphones are used to form a beam that is a cardioid in the free field. The directional pattern is to remain "good" for frequencies down to at least 500 Hz, with good directionality as low as 300 Hz as a goal. For this example, we concentrate on the low frequency behavior, and thus assume that the resonance frequencies and Q values for the two microphones are identical. Further, we assume that manufacturing tolerances on the microphones are such that the rolloff frequency can be controlled to within ±10%.

Figure 10:
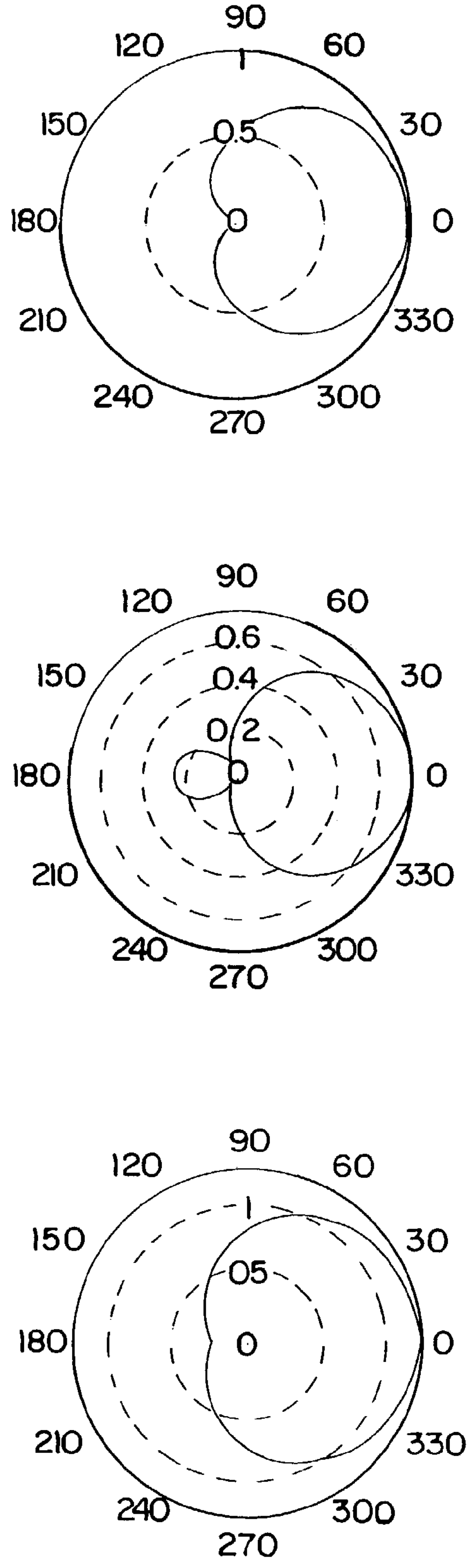
FIG. 10 is a plurality of graphs depicting the pattern variations between a pair of matched microphones at 500 Hz with ±10% variation in low frequency rolloff frequency at 50 Hz.
Figure 11:
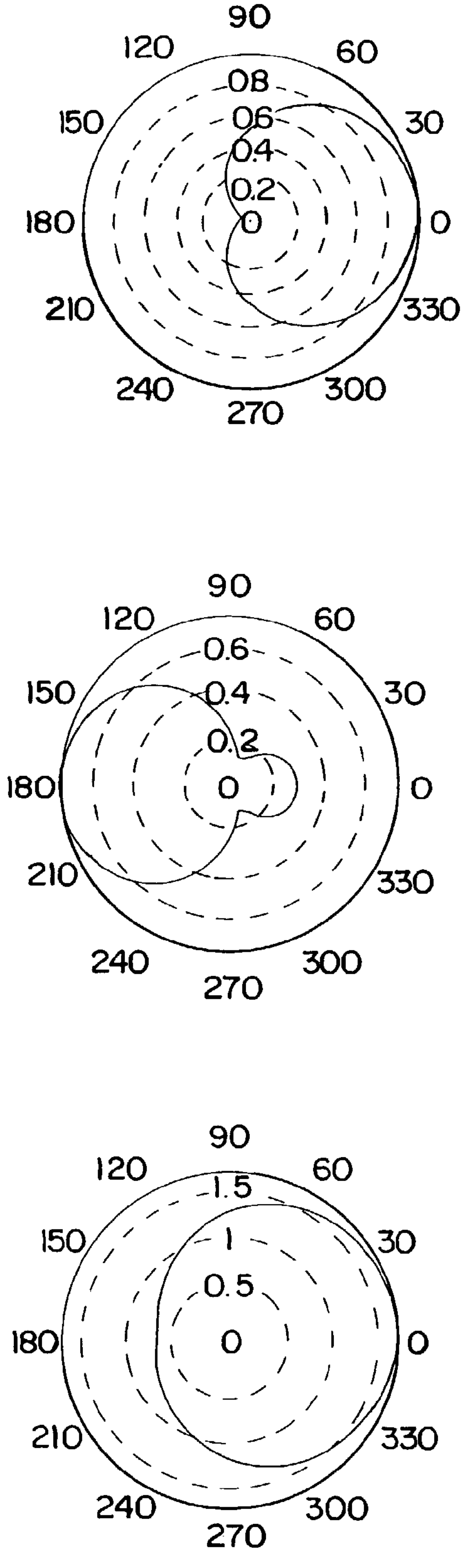
FIG. 11 is a plurality of graphs illustrating the pattern variations between a pair of matched microphones at 300 Hz with ±10% variation in low frequency rolloff frequency at 50 Hz.

In this example, if we set the nominal value for the rolloff to be 50 Hz, the patterns at 500 Hz are shown in FIG. 10. This shows the degradation in the patterns in the worst case situation when one microphone has its rolloff shifted by +10% and the other microphone is shifted by −10%. The patterns at 300 Hz are shown in FIG. 11. The performance is clearly unacceptable at this frequency as the second polar shifts entirely to the backward direction. As a general rule, then, if the low frequency rolloff can only be controlled to ±10%, then adequate beam pattern control can be achieved at frequencies that are approximately a decade above the rolloff frequency.

Figure 12:
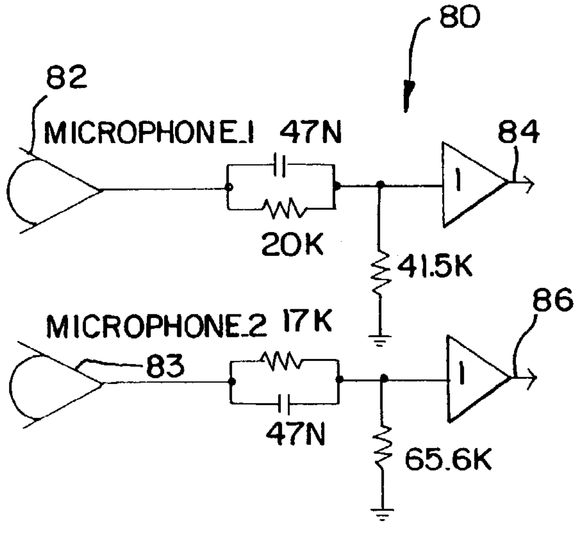
FIG. 12 is a simplified electrical circuit diagram, partially in block for, of another circuit for shifting the low frequency rolloff of a pair of microphone outputs.

Now turning to the improvement that can be achieved with phase compensation as described herein, an objective is to use response compensation to achieve good directivity at 500 Hz using microphones whose low frequency rolloff varies by ±10% from a nominal value of 225 Hz. Another circuit 80 having the correct response for compensation of a pair of microphones is shown in FIG. 12. The strategy is to compensate each of the two microphones 82, 83 to provide an output 84, 85, respectively, whose low frequency rolloff is at 250 Hz regardless of the uncompensated rolloff frequency. With sufficient resolution in the component values, this circuit 80 exactly compensates the difference in responses so that their frequency responses are identical.

In this example, in determining how much resolution is actually needed to achieve adequate directionality, it is assumed that the population of microphones described above includes samples with rolloff frequencies from approximately 200 Hz to 250 Hz. For instance, five compensation circuits can be provided which exactly compensate the response of microphones whose rolloff frequencies are at 205 Hz, 215 Hz, 225 Hz, 235 Hz, and 245 Hz with each microphone connected to the compensation circuit that most closely matches its actual rolloff frequency. Thus, the maximum deviation from "ideal" compensation is ±5 Hz or ±2½% in rolloff frequency.

Figure 13A:
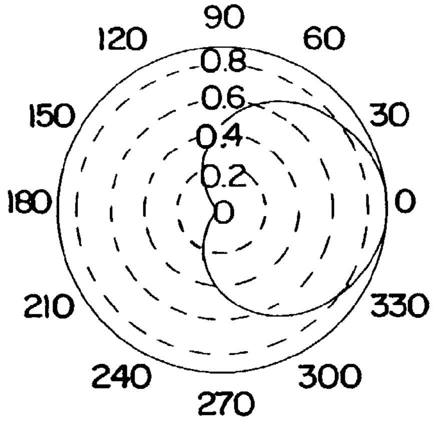
FIG. 13 is a plurality of graphs showing the improvement in directionality that is available with compensation, even when the compensation is imperfect.
Figure 13B:
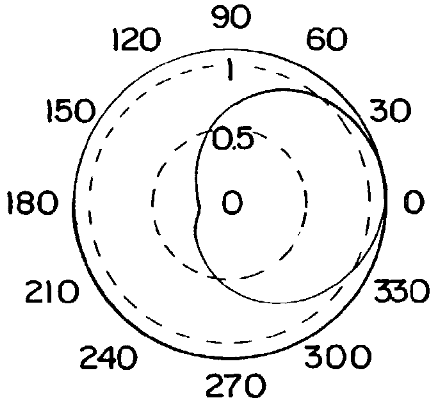
Figure 13C:
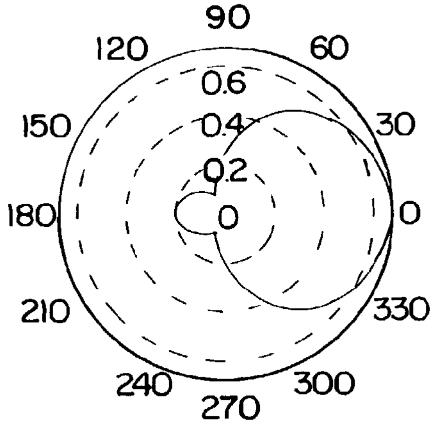

FIG. 13 shows the improvement that is available with compensation, even when the compensation is imperfect. These polars are calculated at 500 Hz, with the compensated rolloff frequency at 250 Hz. In the top example (i.e., graph A of FIG. 13), the compensation is perfect. In the other two polars (i.e., graphs B and C of FIG. 13), the compensation is applied imperfectly; in each case, the microphones are compensated for a frequency that is in error by 5 Hz, and the error is in opposite directions for the two microphones. In graphs B and C, the polars have reasonably good directivity even at a frequency that is only an octave above the (compensated) rolloff of the microphones.

The method described herein for the compensation of low frequency rolloff is practically useful and can be implemented in the circuitry inside the microphone if the circuit values can be selected or trimmed to the proper values after the microphone is assembled. In such an embodiment, it is preferred that the low frequency rolloff be measured as a part of the final manufacturing process, and the circuit elements trimmed to the proper values for adequate compensation.

A Practical Example—Resonance Frequency Compensation

As a final example, an electrical circuit is examined to compensate for a manufacturing variation in the resonance frequency of a microphone. Suppose in this example that a microphone has a desired resonance frequency of 6000 Hz, but its actual resonance frequency is 5% lower, or 5700 Hz. If circuit 3 in FIG. 8 is chosen, which reduces the number of reactive components compared to some of the other circuits of FIG. 8, a value of 47 nF can be used for C. This value, while somewhat arbitrary, is the largest value that is conveniently available in a small package. The value of L is calculated to resonate with C at the microphone resonance of 5700 Hz. This yields a value of 16.6 mH for L. Then $C_l$ is calculated to resonate with L at the desired frequency of 6000 Hz. The value of $C_l$ is 42.4 nF, and the value of $C_f$ is 433 nF.

In some applications, the 16 mH inductor and the 433 nF capacitor may be considered too large. An alternative would be to use circuit 2 of FIG. 8, which eliminates the larger capacitor. But this circuit needs a second inductor whose value is approximately 1.6 mH. Accordingly, in an embodiment, is it preferred that the functionality of the compensation circuits of FIG. 8 be implemented using synthetic inductors. This trades more practical reactive component values for additional active components.

In an alternative embodiment, the high frequency performance is improved by using a microphone with a resonance frequency that is above the frequency band that is important for directionality. If the resonance frequency is increased to the vicinity of 13 to 15 kHz, then good directionality is available to at least 10 kHz.

While the specific embodiments have been illustrated and described, numerous modifications come to mind without significantly departing from the spirit of the invention and the scope of protection is only limited by the scope of the accompanying Claims.

I claim:

1. A device for receiving an audible input comprising:

a hearing aid housing;

a first microphone operably attached to the hearing aid housing and having an output responsive to the audible input;

a second microphone operably attached to the hearing aid housing and having an output responsive to the audible input;

a phase adjustment circuit responsive to the first microphone output and a rolloff control output for producing a compensated microphone output; and a subtractor circuit responsive to the compensated microphone output and the second microphone output for generating the rolloff control output.

2. The device of claim 1, further comprising a bandpass filter operably connected between the subtractor circuit and the compensated microphone output.

3. The device of claim 2, further comprising a bandpass filter operably connected between the subtractor circuit and the second microphone output.

4. The device of claim 3, further comprising a buffer operably connected to the compensated microphone output.

5. The device of claim 4, further comprising a buffer operably connected to the second microphone output.

6. The device of claim 1, further comprising a feedback circuit operably connected to the compensated microphone output and the phase adjustment circuit.

7. The device of claim 6, wherein the said feedback circuit includes a capacitor.

8. The device of claim 1, wherein the outputs of the microphones have a resonance frequency and a circuit is operably connected to at least one of the microphones for shifting the resonance frequency within the output of the microphone.

9. The device of claim 1, wherein the phase adjustment circuit comprises:

an amplifier having an inverting input and an output;

a gain control circuit operably connected between the first microphone output and the inverting input of the amplifier for adjusting the gain of the first microphone output; and a feedback circuit operably connected to the output of the amplifier and the inverting input, the feedback circuit including a feedback adjustment circuit responsive to the rolloff control output.

10. The device of claim 9, wherein said feedback circuit includes a capacitor.

* * * * *